United States Patent
Muchherla et al.

(10) Patent No.: US 11,309,052 B2
(45) Date of Patent: Apr. 19, 2022

(54) READ VOLTAGE CALIBRATION FOR COPYBACK OPERATION

(71) Applicant: Micron Technology, Inc., Boise, ID (US)

(72) Inventors: Kishore K. Muchherla, Fremont, CA (US); Niccolo' Righetti, Boise, ID (US); Jeffrey S. McNeil, Jr., Nampa, ID (US); Akira Goda, Setagaya (JP); Todd A. Marquart, Boise, ID (US); Mark A. Helm, Santa Cruz, CA (US); Gil Golov, Backnang (DE); Jeremy Binfet, Boise, ID (US); Carmine Miccoli, Boise, ID (US); Giuseppina Puzzilli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 17/001,723

(22) Filed: Aug. 25, 2020

(65) Prior Publication Data

US 2022/0068426 A1    Mar. 3, 2022

(51) Int. Cl.

| | |
|---|---|
| *G11C 29/42* | (2006.01) |
| *G11C 29/44* | (2006.01) |
| *G06F 11/30* | (2006.01) |
| *G06F 11/07* | (2006.01) |
| *G11C 29/12* | (2006.01) |

(52) U.S. Cl.
CPC ............ *G11C 29/44* (2013.01); *G06F 11/076* (2013.01); *G06F 11/0772* (2013.01); *G06F 11/3037* (2013.01); *G11C 29/12005* (2013.01); *G11C 29/42* (2013.01)

(58) Field of Classification Search
CPC ... G11C 29/44; G11C 29/12005; G11C 29/42; G06F 11/076; G06F 11/0772; G06F 11/3037
USPC ........................................ 365/185.09, 185.19
See application file for complete search history.

(56) References Cited

U.S. PATENT DOCUMENTS

| | | | |
|---|---|---|---|
| 8,849,104 B2 | 9/2014 | Eder | |
| 10,274,948 B2 | 4/2019 | Penilla et al. | |
| 10,453,537 B1* | 10/2019 | Reuter | G11C 16/26 |
| 10,942,662 B2* | 3/2021 | Tomic | G06F 3/0689 |
| 2017/0372431 A1 | 12/2017 | Perl | |
| 2019/0066802 A1* | 2/2019 | Malshe | G11C 16/349 |

(Continued)

*Primary Examiner* — Michael T Tran
(74) *Attorney, Agent, or Firm* — Brooks, Cameron & Huebsch, PLLC

(57) ABSTRACT

A system includes a memory device having a plurality of groups of memory cells and a processing device communicatively coupled to the memory device. The processing device is be configured to read a first group of memory cells of the plurality to determine a calibrated read voltage associated with the group of memory cells. The processing device is further configured to determine, using the calibrated read voltage associated with the first group of memory cells, a bit error rate (BER) of a second group of memory cells of the plurality. Prior to causing the memory device to perform a copyback operation on the plurality of groups of memory cells, the processing device is further configured to determine whether to perform a subsequent read voltage calibration on at least the second group of the plurality based, at least partially, on a comparison between the determined BER and a threshold BER.

20 Claims, 7 Drawing Sheets

(56) References Cited

U.S. PATENT DOCUMENTS

| | | | |
|---|---|---|---|
| 2019/0339902 A1* | 11/2019 | Yanes | G06F 3/0652 |
| 2020/0066353 A1* | 2/2020 | Pletka | G06F 3/0604 |
| 2020/0066355 A1* | 2/2020 | Papandreou | G11C 16/0483 |
| 2021/0043258 A1* | 2/2021 | Liikanen | G06F 3/0616 |
| 2021/0193229 A1* | 6/2021 | Liikanen | G06F 11/076 |

* cited by examiner

READ VOLTAGE CALIBRATION FOR COPYBACK OPERATION

TECHNICAL FIELD

Embodiments of the disclosure relate generally to memory systems and more specifically relate to read voltage calibration for copyback operation.

BACKGROUND

A memory system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
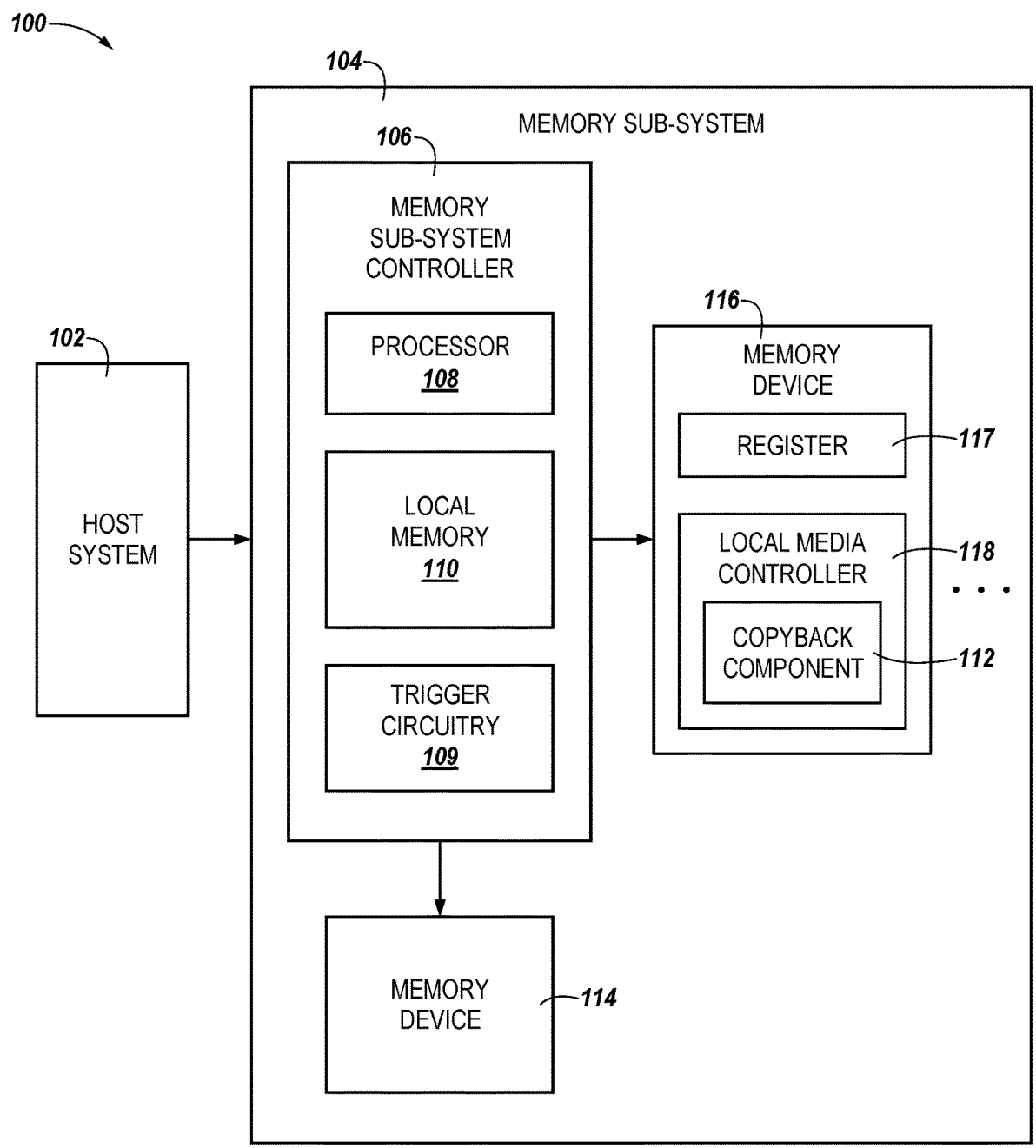
FIG. 1 illustrates an example computing system that includes a memory sub-system in accordance with some embodiments of the present disclosure.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices, such as memory devices that store data. The host system can provide data to be stored at the memory sub-system and can request data to be retrieved from the memory sub-system.

The memory sub-system can be used for storage of data by various components of the vehicle, such as applications that are run by a host system of the vehicle. One examples of such an application is an event recorder of the vehicle. The event recorder may also be referred to as a "black box" or accident data recorder.

The emergence of autonomous vehicles, Internet of Things (IoT) and surveillance devices has resulted in a wider gap in between the total bytes written (TBW) in a useable lifetime of a memory sub-system and a user capacity of the memory sub-system. For example, the TBW to user capacity ratio for some memory systems used for such applications has increased by one to three orders of magnitude. Some autonomous vehicles require real time buffering of telemetric data such as video cameras, radar, lidar, ultra-sonic and other sensors that are necessary to playback the sequences preceding an accident. The data from various sensors sums up to a substantial throughput requirement per unit time (e.g., 1 gigabyte per second (GB/sec) sequential write throughput from a host). Upon a trigger event, a quantity of data corresponding to a predetermined playback time immediately preceding the event needs to be captured (e.g., to determine the cause of an accident). The recorded telemetric sensor data corresponding to the predetermined playback time can be referred to as a "snapshot". An event recorder is one such application in where the user capacity requirement could be as low as one hundred and twenty-eight (128) GB, but the TBW requirement could be as high as hundreds of Peta Bytes. The examples of values given are not limiting but highlight the relative difference between the requirements for capacity and TBW. An event recorder may need to store at least a few, most recent snapshots.

Capturing and storing the buffered data from the sensors of the vehicle as a snapshot upon a trigger event can involve transferring (e.g., moving) the buffered sensor data from one memory portion (e.g., a buffer portion) of the memory sub-system of the event recorder to another memory portion (e.g., a snapshot portion) of the memory sub-system of the event recorder. For instance, in some approaches, the data can be sensed (e.g., read) from the buffer memory portion, and sent to a controller of the memory sub-system that is external to the memory. The external controller can detect and correct any errors in the data, and then send the corrected data back to the memory to be programmed to the snapshot memory portion. However, sending the data back and forth between the memory and the controller can take time and consume energy, thereby adversely affecting the performance of the memory sub-system of the event recorder. For example, increased energy consumption associated with transferring the data can lead to a need for a larger back up power supply (e.g., hold-up capacitor), which can lead to increased cost/size associated with the overall system.

In some approaches, a copyback operation can be performed by the memory to move the data from the buffer memory portion to the snapshot memory portion without transferring the data between the memory and the external controller and/or without performing an error correction operation on the data. Such an approach can reduce the amount of time and energy used to move the data from the buffer memory portion to the snapshot memory portion. However, without performing an error correction operation (e.g., an error correction code (ECC) operation) on the data, any errors in the data stored in the buffer memory portion will also be propagated (e.g., copied) to the snapshot memory portion in such an approach, which can cause corruption of the data stored in the snapshot portion. Accordingly, it is desirable to provide an increased level of confidence that data being transferred via a copyback operation has relatively few errors in order to reduce the likelihood of errors being propagated from the source location (e.g., block) to destination location.

Aspects of the present disclosure address the above and other deficiencies by having a memory sub-system that utilizes a component included in the memory of the sub-system to determine a degree of a read voltage calibration to be performed on data for copying the data from one memory portion (e.g., buffer portion) to another memory portion (e.g., snapshot portion) via a copyback operation. The read voltage calibration adjusts a read voltage used to read data, which reduces likelihood of erroneous reading of the data. The component can be utilized to perform a read voltage calibration on a portion (e.g., a sample) of data (e.g., prior to copying to the snapshot portion) and determine whether a read voltage calibrated based on the sample is also suitable to be used in association with a remaining portion of the data. Such an approach can eliminate a need to perform additional read voltage calibrations on the remaining portion when they are not necessary for maintaining minimum data reliability, which can reduce errors in copying the data to the snapshot portion enough to prevent the data stored in the snapshot portion from being corrupted.

The figures herein follow a numbering convention in which the first digit or digits correspond to the drawing figure number and the remaining digits identify an element or component in the drawing. Similar elements or components between different figures can be identified by the use of similar digits. For example, 106 can reference element "06" in FIG. 1, and a similar element can be referenced as 506 in FIG. 5. Analogous elements within a Figure may be referenced with a hyphen and extra numeral or letter. Such analogous elements may be generally referenced without the hyphen and extra numeral or letter. For example, elements 544-1, 544-2, and 544-N in FIG. 5 may be collectively referenced as 544. As used herein, the designators "B", "N", "P", "R", and "S", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 illustrates an example computing system 100 that includes a memory sub-system 104 in accordance with some embodiments of the present disclosure. The memory sub-system 104 can include media, such as one or more volatile memory devices (e.g., memory device 114), one or more non-volatile memory devices (e.g., memory device 116), or a combination of such.

A memory sub-system 104 can be a storage device, a memory module, or a hybrid of a storage device and memory module. Examples of a storage device include an SSD, a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), IoT enabled device, embedded computer (e.g., one included in a vehicle, industrial equipment, or a networked commercial device), or similar computing system that includes memory and a processing device.

The computing system 100 includes a host system 102 that is coupled to one or more memory sub-systems 104. In some embodiments, the host system 102 is coupled to different types of memory sub-systems 104. FIG. 1 illustrates one example of a host system 102 coupled to one memory sub-system 104. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

In at least one embodiment, the host system 102 is a computing device that controls a vehicle, such as an autonomous vehicle, and the memory sub-system 104 is an SSD that provides event recorder storage for the vehicle. For example, the memory sub-system 104 can store time based telemetric sensor data for the vehicle. Time based telemetric sensor data is defined in more detail with respect to FIG. 6.

The host system 102 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, etc.). The host system 102 uses the memory sub-system 104, for example, to write data to the memory sub-system 104 and read data from the memory sub-system 104.

The host system 102 can be coupled to the memory sub-system 104 via a physical host interface. Examples of a physical host interface include, but are not limited to, a serial advanced technology attachment (SATA) interface, a PCIe interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 102 and the memory sub-system 104. The host system 102 can further utilize an NVM Express (NVMe) interface to access components (e.g., memory devices 116) when the memory sub-system 104 is coupled with the host system 102 by the PCIe interface. The physical host interface can provide an interface for passing control, address, data, and other signals between the memory sub-system 104 and the host system 102. FIG. 1 illustrates a memory sub-system 104 as an example. In general, the host system 102 can access multiple memory sub-systems via a same communication connection, multiple separate communication connections, and/or a combination of communication connections.

The host system 102 can send requests to the memory sub-system 104, for example, to store data in the memory sub-system 104 or to read data from the memory sub-system 104. The data to be written or read, as specified by a host request, is referred to as "host data." A host request can include logical address information. The logical address information can be a logical block address (LBA), which can include or be accompanied by a partition number. The logical address information is the location the host system associates with the host data. The logical address information can be part of metadata for the host data. The LBA can also correspond (e.g., dynamically map) to a physical address, such as a physical block address (PBA), that indicates the physical location where the host data is stored in memory.

Some examples of non-volatile memory devices (e.g., memory device 116) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 114 and 116 can include one or more arrays of memory cells. One method of operating a memory cell includes storing one-bit per cell, which is referred to as a single level cell (SLC). An SLC can be programmed to one level other than the erased level. Other methods of operating memory cells include storing multiple (e.g., more than one) bits per cell, such as multi-level cells (MLCs), triple level cells (TLCs), quad-level cells (QLCs), and penta-level cells (PLCs), among others. As used herein, "multi-level cells (MLCs)" refers to memory cells that are programmable to three levels other than an erased level. The term multiple level cells can be used to refer to any cells configured to store more than one bit per cell (e.g., MLCs, TLCs, QLCs, PLCs, etc.) In some embodiments, the non-volatile memory device 116 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the non-volatile memory device 116 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 116 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 106 (or controller 106 for simplicity) can communicate with the memory device 116 to perform operations such as reading data, writing data, erasing data, and other such operations at the non-volatile memory device 116. The memory sub-system controller 106 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 106 can be a microcontroller, special purpose logic circuitry (e.g., a field programmable gate array (FPGA), an application specific integrated circuit (ASIC), etc.), or other suitable circuitry.

The memory sub-system controller 106 can include a processor 108 (e.g., a processing device) configured to execute instructions stored in a local memory 110. In the illustrated example, the local memory 110 of the memory sub-system controller 106 includes an embedded memory configured to store instructions for performing various processes, operations, logic flows, and routines that control operation of the memory sub-system 104, including handling communications between the memory sub-system 104 and the host system 102.

In some embodiments, the local memory 110 can include memory registers storing memory pointers, fetched data, etc. The local memory 110 can also include ROM for storing micro-code, for example. While the example memory sub-system 104 in FIG. 1 has been illustrated as including the memory sub-system controller 106, in another embodiment of the present disclosure, a memory sub-system 104 does not include a memory sub-system controller 106, and can instead rely upon external control (e.g., provided by an external host, or by a processor or controller separate from the memory sub-system 104).

In general, the memory sub-system controller 106 can receive commands or operations from the host system 102 and can convert the commands or operations into instructions or appropriate commands to achieve the desired access to the memory device 116 and/or the memory device 114. The memory sub-system controller 106 can be responsible for other operations such as wear leveling operations, garbage collection operations, error detection and/or correction operations, encryption operations, caching operations, and address translations between a logical address (e.g., LBA, namespace) and a physical address (e.g., physical block address, physical media locations, etc.) associated with the memory device 116. The memory sub-system controller 106 can further include host interface circuitry to communicate with the host system 102 via the physical host interface. The host interface circuitry can convert the commands received from the host system 102 into command instructions to access the memory device 116 and/or the memory device 114 as well as convert responses associated with the memory device 116 and/or the memory device 114 into information for the host system 102.

The memory sub-system controller 106 can include trigger circuitry 109. The trigger circuitry 109 can include an ASIC that can handle information (e.g., sensor information) received in association with a particular event, such as a determination and/or detection of an accident associated with an autonomous vehicle. By way of example and not by way of limitation, a determination as can be made when sensor information is equal to or above a particular threshold value. For example, the threshold value can be a predetermined value programmed at a time of manufacture, or the threshold value can be a value set by programming in a field of use after manufacture. The threshold value can be a value relating to a level of pressure indication from a braking sensor on an autonomous vehicle, a deceleration value received from a sensor, a magnitude and timing abruptness change to a steering sensor, and/or indications relating thereto, etc. The trigger circuitry can provide a trigger event signal and provide the event information (e.g., sensor information) to the processor 108, which in turn can send the signal to local media controller 118 that a trigger event has occurred. As such, the trigger circuitry 109, in some embodiments, can cause the memory sub-system controller 106 and/or local media controller 118 to perform actions to control host data movement between one memory portion (e.g., a cyclic buffer portion) of memory device 116 and another memory portion (e.g., a snapshot portion) of memory device 116, as described according to embodiments herein.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 106 and decode the address to access the memory device 116 and/or the memory device 114.

In some embodiments, the memory device 116 includes a local media controller 118 that operates in conjunction with memory sub-system controller 106 to execute operations on one or more memory cells of the memory device 116. An external controller (e.g., memory sub-system controller 106) can externally manage the non-volatile memory device 116 (e.g., perform media management operations on the memory device 116). In some embodiments, a memory device 116 is a managed memory device, which is a raw memory device combined with a local controller (e.g., local controller 118) for media management within the same memory device package. An example of a managed memory device is a managed NAND (MNAND) device.

The local media controller 118 can also include copyback component 112. Although not shown in FIG. 1 so as to not obfuscate the drawings, the copyback component 112 can include various circuitry to facilitate performance of the operations described herein. For example, the copyback component 112 can include a special purpose circuitry in the form of an ASIC, FPGA, state machine, and/or other logic circuitry that can allow the copyback component 112 to orchestrate and/or perform the operations described herein. In some embodiments, a local media controller 118 of a non-volatile memory device 116 includes at least a portion of the copyback component 112. For example, the local media controller 118 can include a processor (e.g., processing device) configured to execute instructions stored on the memory device 114 for performing the operations described herein with respect to the copyback component 112. In some embodiments, the copyback component 112 is part of the host system 102, an application, or an operating system.

The copyback component 112 can cause the memory device 116 to perform a copyback operation on the memory device 116 in response to receiving the signal indicating that the trigger event has occurred from the trigger circuitry 109. As used herein, the term "copyback operation" refers to an operation to copy data from one location to another location within a memory device without transferring the data to an external controller. For example, the copyback operation performed on the memory device 116 can include copying data from a group of memory cells of the memory device 116 to an internal register 117 located within the memory device 116 and further copying data from the internal register 117 to a different group of memory cells of the memory device 116. Accordingly, a copyback operation caused to be performed by the copyback component 112 can utilize less memory/processing resources of the memory sub-system 104 as data are being copied without transferring the data between the memory and the external controller 106. In some embodiments, a copyback operation can be performed without performing a separate error correction operation (e.g., an ECC operation) on data being copied via the copyback operation.

The copyback component 112 can further perform, as a part of performance of a copyback operation on data, a read voltage calibration. For example, the read voltage calibration can be firstly performed on a sample location (that stores a portion of the data) to determine a calibrated read voltage that correctly determines data values of data read from the sample location. Subsequently, the copyback component 112 further determines if the read voltage calibrated based on the sample location is also suitable to be used in association with other locations in performing the copyback operation. If determined to be suitable, the copyback component 112 can cause the memory device 116 to perform the copyback operation on the other locations without performing subsequent read voltage calibrations on the other locations. As described further herein, whether or not the calibrated read voltage is suitable to be used in association with other locations can be determined based on a comparison between a threshold bit error rate (BER) and BER(s) obtained in response to using the calibrated read voltage on the other locations. Although embodiments are not so limited, a read voltage calibration can be performed once data have been moved to the internal register 117, but prior to being copied to a destination location. Further details with regards to the operations of the copyback component 112 and local media controller 110 are described below.

Figure 2:
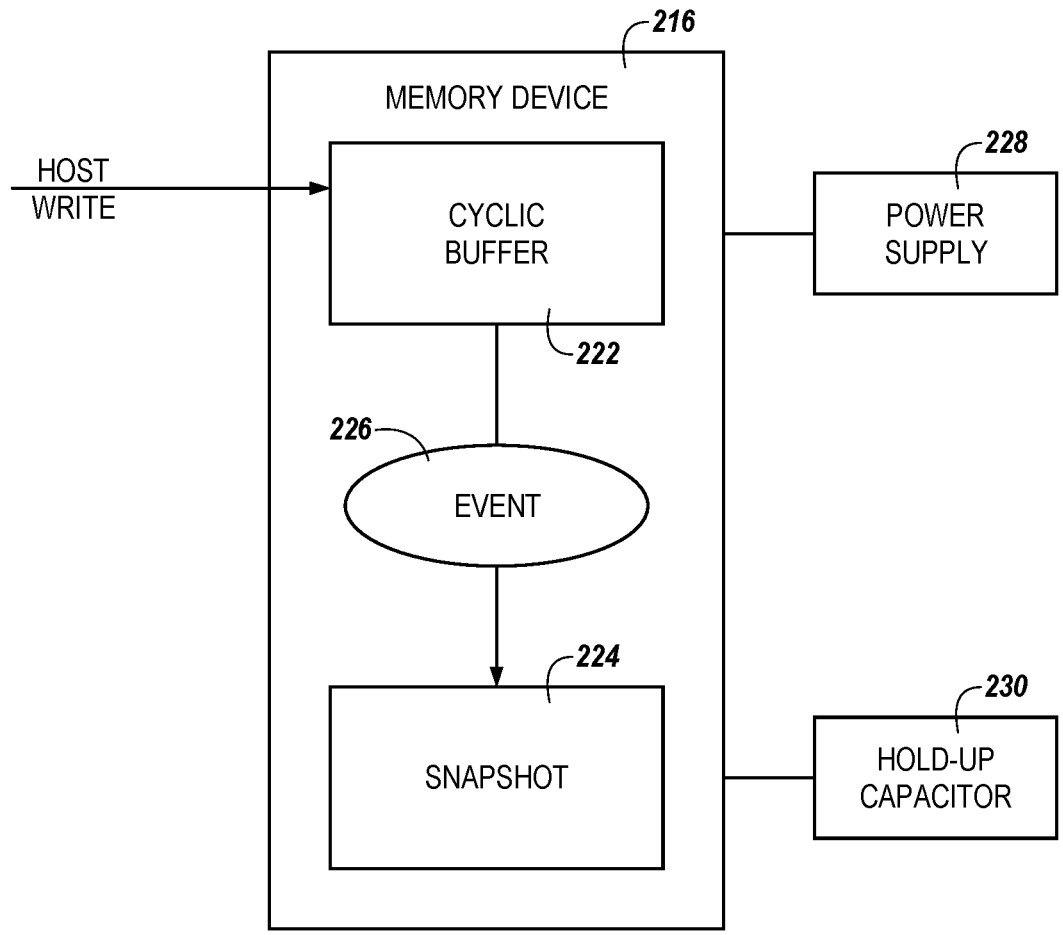
FIG. 2 illustrates an example of a memory device including a cyclic buffer portion and a snapshot portion within a memory device in accordance with some embodiments of the present disclosure.

FIG. 2 illustrates an example of a memory device 216 including a cyclic buffer portion 222 and a snapshot portion 224 within a memory device 216 in accordance with some embodiments of the present disclosure. The memory device 216 can correspond to the memory device 116 of FIG. 1.

The cyclic buffer portion 222 and snapshot portion 224 can be reserved portions of the memory device 216. The cyclic buffer portion 222 and snapshot portion 224 can be within a same partition or within different partitions of the memory device 216. Host data can be received by the memory sub-system. The host data can be time based telemetric sensor data from different sensors of a vehicle. The time based telemetric sensor data from the different sensors can be aggregated by the host and sent to the memory sub-system at a data rate. The host data can be received by the memory sub-system and stored in the cyclic buffer portion 222 of the non-volatile memory device 216. As the cyclic buffer portion 222 is filled with host data, new data received from the host is stored sequentially, but older data in the cyclic buffer portion 222 can be erased or overwritten. The cyclic buffer portion 222 can therefore operate as a first-in-first-out (FIFO) buffer, where newly received data replaced the oldest data therein.

The cyclic buffer portion 222 can be coupled to the snapshot portion 224. Upon occurrence of a trigger event 226, an amount of the time based telemetric sensor data from the cyclic buffer portion 222 can be copied to the snapshot portion 224. The amount of host data corresponding to a defined period of time, which can be referred to as a playback time (e.g., 30 seconds), is referred to as a snapshot size and the data itself over that defined period of time is referred to as a snapshot. The snapshot size can be predefined for a period of time immediately preceding a trigger event. The snapshot size and/or playback time can be a predefined value programmed to the memory sub-system by a manufacturer, supplier, or user of the memory sub-system. In some embodiments, the determination that the trigger event 226 has occurred can include actuation of a trigger signal based at least in part upon received sensor information from a host that is above a threshold, such as a quantitative value.

The cyclic buffer portion 222 can store significantly more data over the service life of the non-volatile memory device 216 than the snapshot portion 224. For example, the cyclic buffer portion 222 can store 3-4 orders of magnitude (1,000-10,000 times) more data than the snapshot portion 224. However, the cyclic buffer portion 222 does not have to have a larger storage capacity than the snapshot portion 224. The size (amount of memory) of the cyclic buffer portion 222 can be dependent, at least in part, on an endurance capability of the cyclic buffer portion 222. For example, if a host is expected to write 150 petabytes (PB) of data to the cyclic buffer portion 222 (TBW is 150 PB) and the endurance capability of the cyclic buffer portion 222 is 5 million PEC, then 30 GB of memory for the cyclic buffer portion 222 is sufficient to satisfy the TBW of 150 PB, provided that data stored by the cyclic buffer portion 222 is overwritten. In contrast, if the endurance capability of the cyclic buffer portion 222 is 500 thousand PEC, then 300 GB of memory for the cyclic buffer portion 222 is necessary to satisfy the TBW of 150 PB. Thus, it can be beneficial to improve (increase) an endurance capability of the non-volatile memory device 216 (e.g., an endurance capability of the cyclic buffer portion 222) so that a higher TBW requirement can be satisfied with a smaller amount of memory. Reducing the amount of memory can reduce manufacturing costs, operating costs, and/or improve performance of the non-volatile memory device 216.

Copying (e.g., via a copyback operation) of a snapshot from the cyclic buffer portion 222 to the snapshot portion 224 can be powered by a power supply 228 of the memory sub-system under normal circumstances. However, copying of the snapshot from the cyclic buffer portion 222 to the snapshot portion 224 can be powered by a backup power supply, such as one or more hold-up capacitors 230 in response to a loss of system power (e.g., the power supply 228), which can be associated with the trigger event 226, such as a vehicle accident. In at least one embodiment, the loss of power from the power supply 228 can be the trigger event 226. A size and/or quantity of the hold-up capacitor(s) 230 are sufficient to provide enough power while one snapshot is being copied from the cyclic buffer portion 222 to the snapshot portion 224. As illustrated, the power supply 228 and the hold-up capacitor 230 are coupled to the memory device 216 to provide power therefor. The power can be provided through write circuitry (not specifically illustrated).

As described herein, the memory device 216 can operate in a predictable manner. For example, the cyclic buffer portion 222 is operated as a FIFO buffer such that sets of data (e.g., time based telemetric sensor data) received from a host are sequentially and consistently written to the cyclic buffer portion 222 while older data are sequentially erased from the cyclic buffer portion 222. Further, for example, it is predictable that, in response to a trigger event, a particular quantity of a subset of the data stored in the cyclic buffer portion 222 and received during a predefined period of time associated with a trigger event (e.g., preceding and/or following the trigger event) are written to the snapshot portion 224. Such a predictable manner in which the memory device 216 operates enables the embodiments of the present disclosure to reduce (simplify) a degree of a read voltage calibration to be performed on the memory device 216. For example, because the data written to the buffer portion 222 is all written within a relatively short time period, the data can lack systematic variations. For instance, the data written to buffer portion 222 can have similar characteristics such as a similar/same write temperature and number of reads (e.g., since being written). Therefore, read voltage calibrations performed at particular locations (e.g., word lines) within the buffer 222 can be expected to apply for accurately reading other locations within the buffer 222.

In some embodiments, memory cells of the cyclic buffer portion 222 can be operated so as to store one bit per cell (SLC mode) and memory cells of the snapshot portion 224 can be operated so as to store more than one bit per cell (e.g., QLC mode). It can take longer to operate memory cells that store more than one bit per cell than to operate memory cells that store only one bit per cell. For example, an increased number of data states represented by the memory cells having multiple bits per cell can further increase complexity of an algorithm associated with programming, reading, and/or erasing the memory cells. Therefore, the memory cells programmed to store multiple bits per cell can have a different programming characteristic. For example, memory cells programmed to store more than one bit per cell can have a slower data transfer rate (longer programming time), greater endurance characteristic (which indicates how reliably a memory cell operates after various quantities of program/erase cycles), and/or less reliability characteristic, than that of the SLC memory cells and/or memory cells programmed to store fewer bits per cell. Further, Memory cells of the cyclic buffer portion 222 can be operated with a faster programming time than a programming time for the memory cells of the snapshot portion 224.

Figure 3:
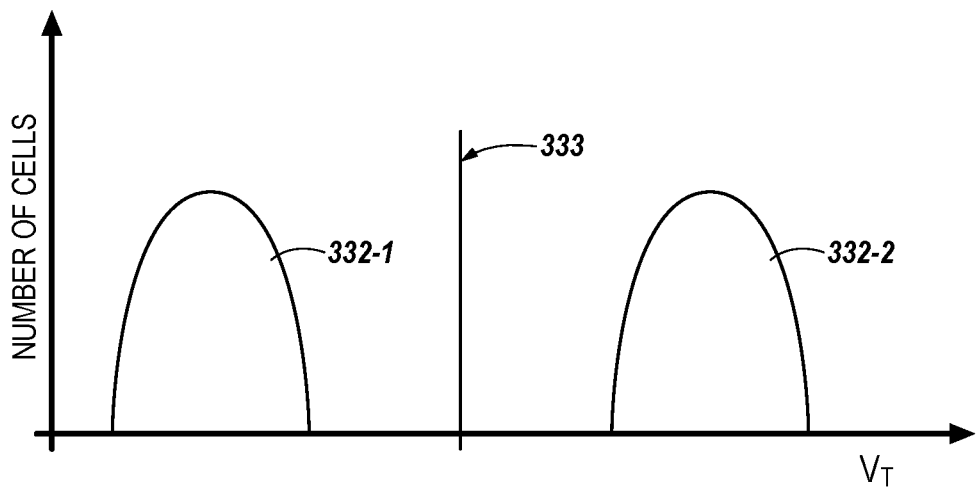
FIG. 3 illustrates threshold voltage distributions in relation to a number of cells in accordance with some embodiments of the present disclosure.

FIG. 3 illustrates threshold voltage (Vt) distributions 332-1 and 332-2 corresponding to adjacent states associated with a number of cells in accordance with some embodiments of the present disclosure. As an example, the Vt distribution 332-1 can correspond to an erased state and can represent a logical "1," and Vt distribution 332-2 can correspond to a programmed state representing a logical "0". Embodiments are not so limited. For example, distributions 332-1 and 332-2 could correspond to adjacent QLC states.

In FIG. 3, a read voltage 333 can be used to determine (e.g., read) whether a memory cell is programmed to state 332-1 or 332-2. As one of ordinary skill in the art will appreciate, programmed Vt distributions (e.g., 332-1 and 332-2) can shift (e.g., undesirably) over time. Therefore, a BER associated with reading cells programmed to states 332-1 and 332-2 can change for a given read voltage 333. As described herein, a number of embodiments of the present disclosure can include performing a read voltage calibration operation in association with performing a copyback operation.

A read voltage calibration operation can include reading a page of data using a number of different read voltages and utilizing the read voltage of the number that results in a lowermost BER as the calibrated read voltage. The calibrated read voltage may then be used to read a number of other pages of data. In some embodiments, a calibrated read voltage determined by reading a particular group (e.g., page) of memory cells can be used to read one or more other groups (e.g., pages) of memory cells in order to determine whether the BER of the one or more other groups of memory cells is below a threshold BER associated with deciding whether or not a copyback operation can be performed. In this manner, determining a separate calibrated read voltage for all groups of memory cells can be avoided, which can save time and processing resources. In a number of embodiments, a BER obtained in response to using the calibrated read voltage on the one or more other groups of memory cells can be compared to a threshold BER. If the obtained BER is below the threshold BER, it indicates that the calibrated read voltage can be used in performing a read/copyback operation on the other group without yielding substantial errors associated with performance of the operation(s). Accordingly, for example, the calibrated read voltage resulting in a BER below the threshold BER can be used to perform a copyback operation to copy data from the one or more other groups of memory cells to a destination location, such as snapshot portion of memory (e.g., the snapshot portion 224 as illustrated in FIG. 2).

Figure 4:
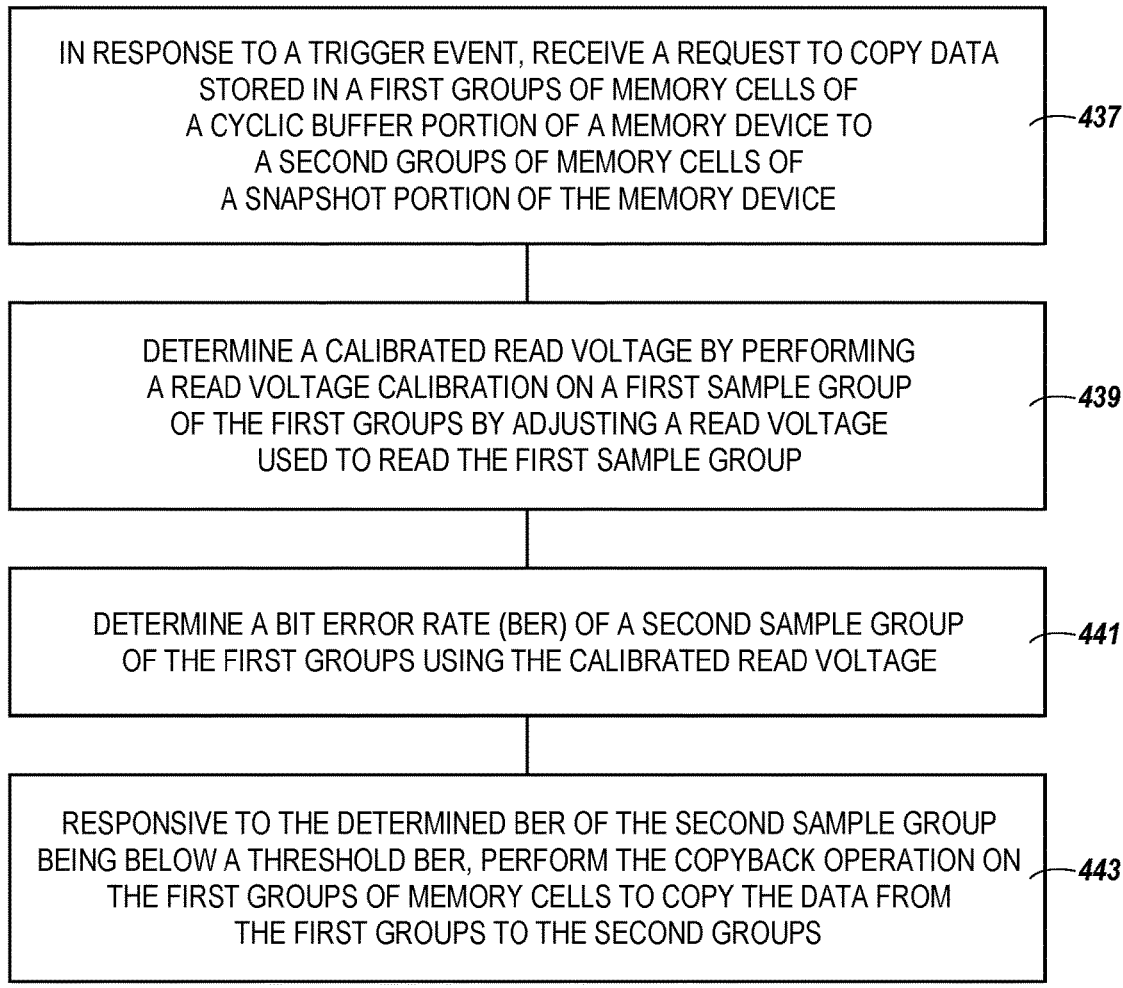
FIG. 4 is a flow diagram of an example method for performing a read voltage calibration for a copyback operation in accordance with some embodiments of the present disclosure.

FIG. 4 is a flow diagram of an example method 435 for performing a read voltage calibration for a copyback operation in accordance with some embodiments of the present disclosure. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed by or using the memory sub-system controller 106, processing device 108, copyback component 112, non-volatile memory device 116 and/or volatile memory device 114, and/or local media controller 118 shown in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 437, a request to copy data stored in a first number of groups of memory cells of a cyclic buffer portion (e.g., the cyclic buffer portion 222 illustrated in FIG. 2) of a memory device (e.g., the non-volatile memory device 116 illustrated in FIG. 1) to a second number of groups of memory cells of a snapshot portion (e.g., the snapshot portion 224 illustrated in FIG. 2) of the memory device can be received in response to a trigger event. In some embodiments, memory cells of the first number of groups of cells of the cyclic buffer portion can be operated in a SLC mode, while memory cells of the second number of groups of cells of the snapshot portion can be operated in a multiple level cell mode (e.g., QLC mode). However, memory cells of the cyclic buffer are not limited to a particular mode. For example, the memory cells of the cyclic buffer can also be operated according to a non-SLC mode, such as MLC, TLC, QLC, PLC, etc.

At operation 439, a calibrated read voltage can be determined by performing a read voltage calibration on a first sample group of a first number of groups of memory cells by adjusting a read voltage used to read the first sample group. The first sample group can be read using multiple read voltages and a voltage level of the calibrated read voltage can be determined based on BERs obtained in response to using multiple read voltages. For example, a read voltage that falls within a read window between Vts and at which a minimum BER occurs for the first sample group can be determined as the calibrated read voltage, as illustrated in FIG. 4.

At operation 441, a bit error rate (BER) of a second sample group of the first number of groups can be determined using the calibrated read voltage. At operation 443, data from at least one of the first number of groups can be copied to the second number of groups using the calibrated read voltage responsive to the determined BER of the second sample group being below a threshold BER. For example, data values stored in the first number of groups of memory cells can be determined by reading at least one group of the first number of groups of memory cells using the calibrated read voltage and the determined data values can be written to the second number of groups of memory cells of the snapshot portion.

In some embodiments, if the determined BER of the second sample group is determined to be above the threshold BER, a subsequent read voltage calibration can be performed on at least the second sample group of the first number of groups to determine an additional calibrated read voltage. Subsequently, the calibrated read voltage can be used to copy (e.g., via a copyback operation) data from the first sample page to the second number of groups and the additional calibrated read voltage can be used to copy (e.g., via a copyback operation) data from the at least the second sample group using to the second number of groups.

Figure 5:
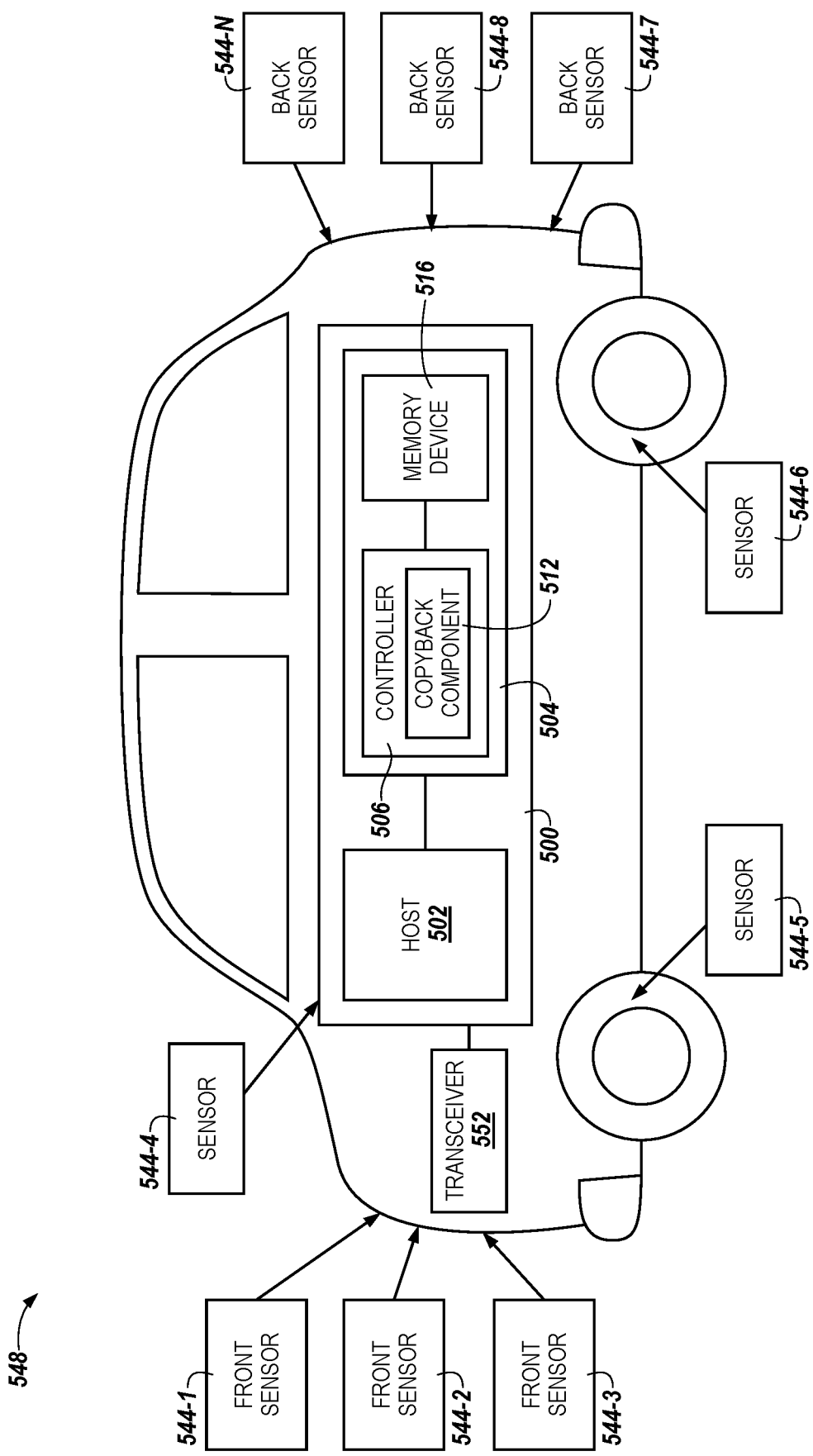
FIG. 5 illustrates an example of a system including a computing system in a vehicle in accordance with some embodiments of the present disclosure.

FIG. 5 illustrates an example of a system 548 including a computing system 500 in a vehicle 550 in accordance with some embodiments of the present disclosure. The computing system 500 can include a memory sub-system 504, which is illustrated as including a controller 506 and non-volatile memory device 516 for simplicity but is analogous to the memory sub-system 104 illustrated in FIG. 1. The controller 506 can be analogous to the memory sub-system controller 106 illustrated in FIG. 1. The controller 506 can further include a copyback component 512 respectively within the controller 506. As described herein, the copyback component 512, in some embodiments, can cause the controller 506 to perform operations described to be performed in association with the copyback component 112, such as a copyback operation.

The computing system 500, and thus the host 502, can be coupled to a number of sensors 544 either directly, as illustrated for the sensor 544-4 or via a transceiver 552 as illustrated for the sensors 544-1, 544-2, 544-3, 544-5, 544-6, 544-7, 544-8, . . . , 544-N. Data obtained from the sensors 544 can be collectively received at the host 502, which can provide the received data to one or more memory sub-systems 504 such that data from multiple sensors can be received at the one or more memory sub-systems 504 as a single data stream.

The transceiver 552 is able to receive time based telemetric sensor data from the sensors 544 wirelessly, such as by radio frequency communication. In at least one embodiment, each of the sensors 544 can communicate with the computing system 500 wirelessly via the transceiver 552. In at least one embodiment, each of the sensors 544 is connected directly to the computing system 500 (e.g., via wires or optical cables). As used herein, telemetric sensor data means that the data is collected by sensors 544 that are remote from the memory sub-system 504 that stores the data (the receiving equipment). The telemetric sensor data is time based because the data is correlated with time. The time corresponding to each data point can either be stored with the telemetric data or derivable therefrom based on some metric, such as a known start time for the data and a data rate. The time can be useful in the playback of the sequences preceding an accident, for example.

The vehicle 550 can be a car (e.g., sedan, van, truck, etc.), a connected vehicle (e.g., a vehicle that has a computing capability to communicate with an external server), an autonomous vehicle (e.g., a vehicle with self-automation capabilities such as self-driving), a drone, a plane, a ship, and/or anything used for transporting people and/or goods.

The sensors 544 are illustrated in FIG. 5 as including example attributes. For example, sensors 544-1, 544-2, and 544-3 are camera sensors collecting data from the front of the vehicle 550. Sensors 544-4, 544-5, and 544-6 are microphone sensors collecting data from the from the front, middle, and back of the vehicle 550. The sensors 544-7, 544-8, and 544-N are camera sensors collecting data from the back of the vehicle 550. As another example, the sensors 544-5, 544-6 are tire pressure sensors. As another example, the sensor 544-4 is a navigation sensor, such as a global positioning system (GPS) receiver. As another example, the sensor 544-6 is a speedometer. As another example, the sensor 544-4 represents a number of engine sensors such as a temperature sensor, a pressure sensor, a voltmeter, an ammeter, a tachometer, a fuel gauge, etc. As another example, the sensor 544-4 represents a video camera.

In some embodiments, the system 500 can be related to a braking system of the vehicle and can receive time based telemetric sensor data from to the camera sensors 544, the temperature sensors 544, and/or acoustic sensors 544. In some embodiments, the system 500 can be related to a heating/cooling system of the vehicle and can receive time based telemetric sensor data from temperature sensors 544 and/or acoustic sensors 544. In some embodiments, the system 500 can be related to an ambient noise system and can receive time based telemetric sensor data from acoustic sensors 544.

The host 502 can execute instructions to provide an overall control system and/or operating system for the vehicle 550. The host 502 can be a controller designed to assist in automation endeavors of the vehicle 550. For example, the host 502 can be an advanced driver assistance system controller (ADAS). An ADAS can monitor data to prevent accidents and provide warning of potentially unsafe situations. For example, the ADAS can monitor sensors in the vehicle 550 and take control of vehicle 550 operations to avoid accident or injury (e.g., to avoid accidents in the case of an incapacitated user of a vehicle). The host 502 can be desired to act and make decisions quickly to avoid accidents. The memory sub-system 504 can store reference data in the non-volatile memory device 516 such that time based telemetric sensor data from the sensors 544 can be compared to the reference data by the host 502 in order to make quick decisions.

Figure 6:
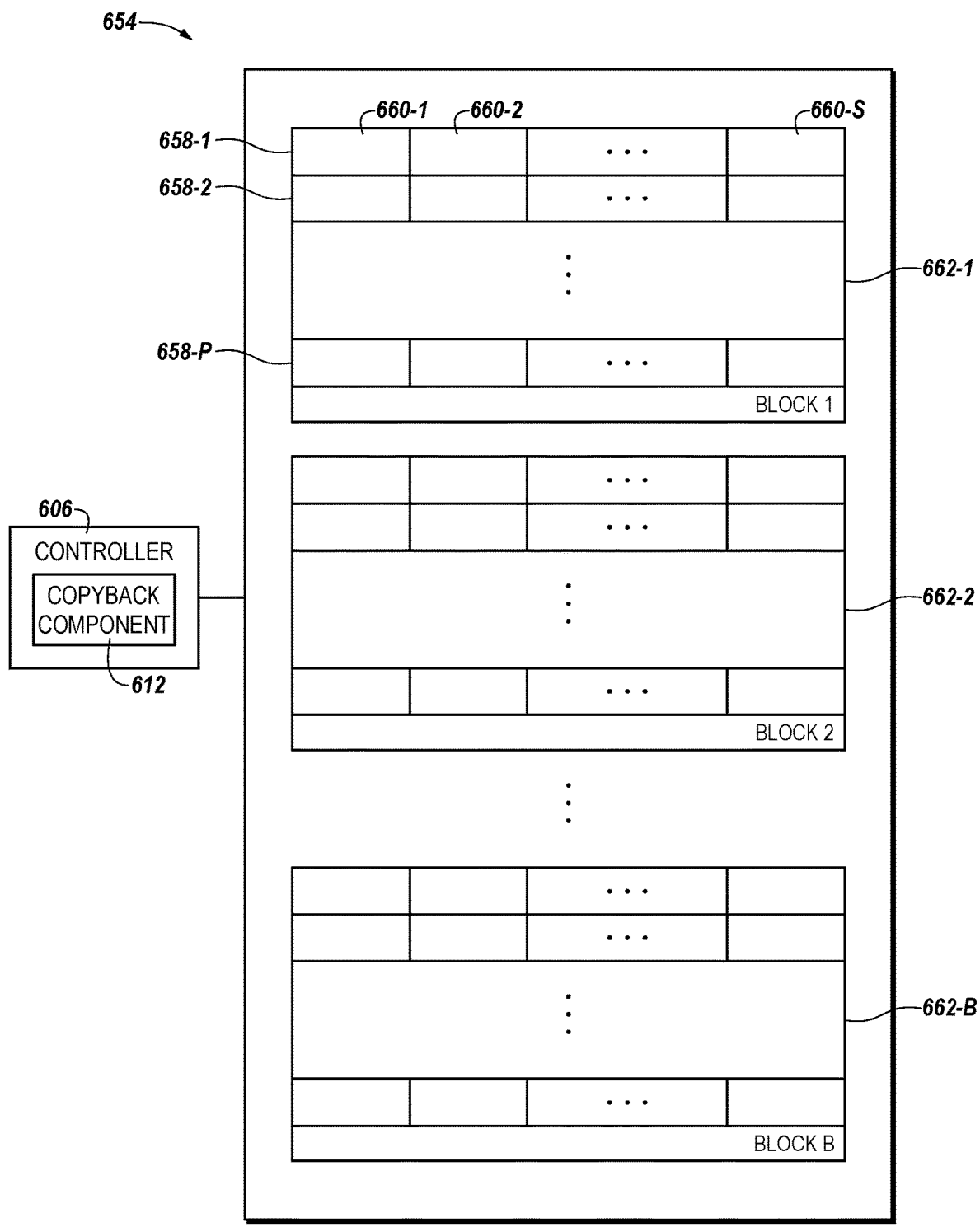
FIG. 6 illustrates a diagram of a portion of a memory array having physical blocks coupled to a controller in accordance with some embodiments of the present disclosure.

FIG. 6 illustrates a diagram of a portion of a memory array 654 having physical blocks 662 coupled to a controller 606 in accordance with some embodiments of the present disclosure. The controller 606 can be analogous to the memory sub-system controller 106 illustrated in FIG. 1. The controller 606 can further include a copyback component 612. As described herein, the copyback component 612, in some embodiments, can cause the controller 606 to perform operations described herein with respect to the copyback component 112, such as a copyback operation.

The memory array 654 can represent a memory array of the non-volatile memory device 116 in FIG. 1, for example. The memory array 654 can be, for example, a NAND flash memory array. As an additional example, memory array 654 can be an SCM array, such as, for instance, a three-dimensional cross-point memory array, a ferroelectric RAM (FRAM) array, or a resistance variable memory array such as a PCRAM, RRAM, or spin torque transfer (STT) array, among others. Further, although not shown in FIG. 6, memory array 654 can be located on a particular semiconductor die along with various peripheral circuitry associated with the operation thereof.

As shown in FIG. 6, the memory array 654 has a number of physical blocks 662-1 (BLOCK 1), 662-2 (BLOCK 2), . . . , 662-B (BLOCK B) of memory cells. The memory cells can be operated with characteristics tailored to an operation target of the cyclic buffer or the snapshot as described herein). A number of physical blocks 662 of memory cells can be included in a plane of memory cells, and a number of planes of memory cells can be included on a die. For instance, in the example shown in FIG. 6, each physical block 662 can be part of a single die. That is, the portion of the memory array 654 illustrated in FIG. 6 can be a die of memory cells.

As shown in FIG. 6, each physical block 662 includes a number of physical rows (e.g., rows 658-1, 658-2, . . . , 658-R) of memory cells coupled to access lines (e.g., word lines). Further, although not shown in FIG. 6, the memory cells can be coupled to sense lines (e.g., data lines and/or digit lines). As one of ordinary skill in the art will appreciate, each row 658 can include a number of pages of memory cells (e.g., physical pages). A physical page refers to a unit of programming and/or sensing (e.g., a number of memory cells that are programmed and/or sensed together as a functional group). In the embodiment shown in FIG. 6, each row 658 includes one physical page of memory cells. However, embodiments of the present disclosure are not so limited. For instance, in an embodiment, each row can include multiple physical pages of memory cells (e.g., one or more even pages of memory cells coupled to even-numbered bit lines, and one or more odd pages of memory cells coupled to odd numbered bit lines). Additionally, for embodiments including multilevel cells, a physical page of memory cells can store multiple logical pages of data (e.g., an upper page of data and a lower page of data, with each cell in a physical page storing one or more bits towards an upper page of data and one or more bits towards a lower page of data).

As shown in FIG. 6, a row 658 of memory cells can include a number of physical sectors 660-1, 660-2, . . . , 660-S (e.g., subsets of memory cells). Each physical sector 660 of cells can store a number of logical sectors of data. Additionally, each logical sector of data can correspond to a portion of a particular page of data. As an example, one logical sector of data stored in a particular physical sector can correspond to a logical sector corresponding to one page of data, and the other logical sector of data stored in the particular physical sector can correspond to the other page of data. Each physical sector 660, can store system data, user data, and/or overhead data, such as error correction code (ECC) data, LBA data, and metadata.

Figure 7:
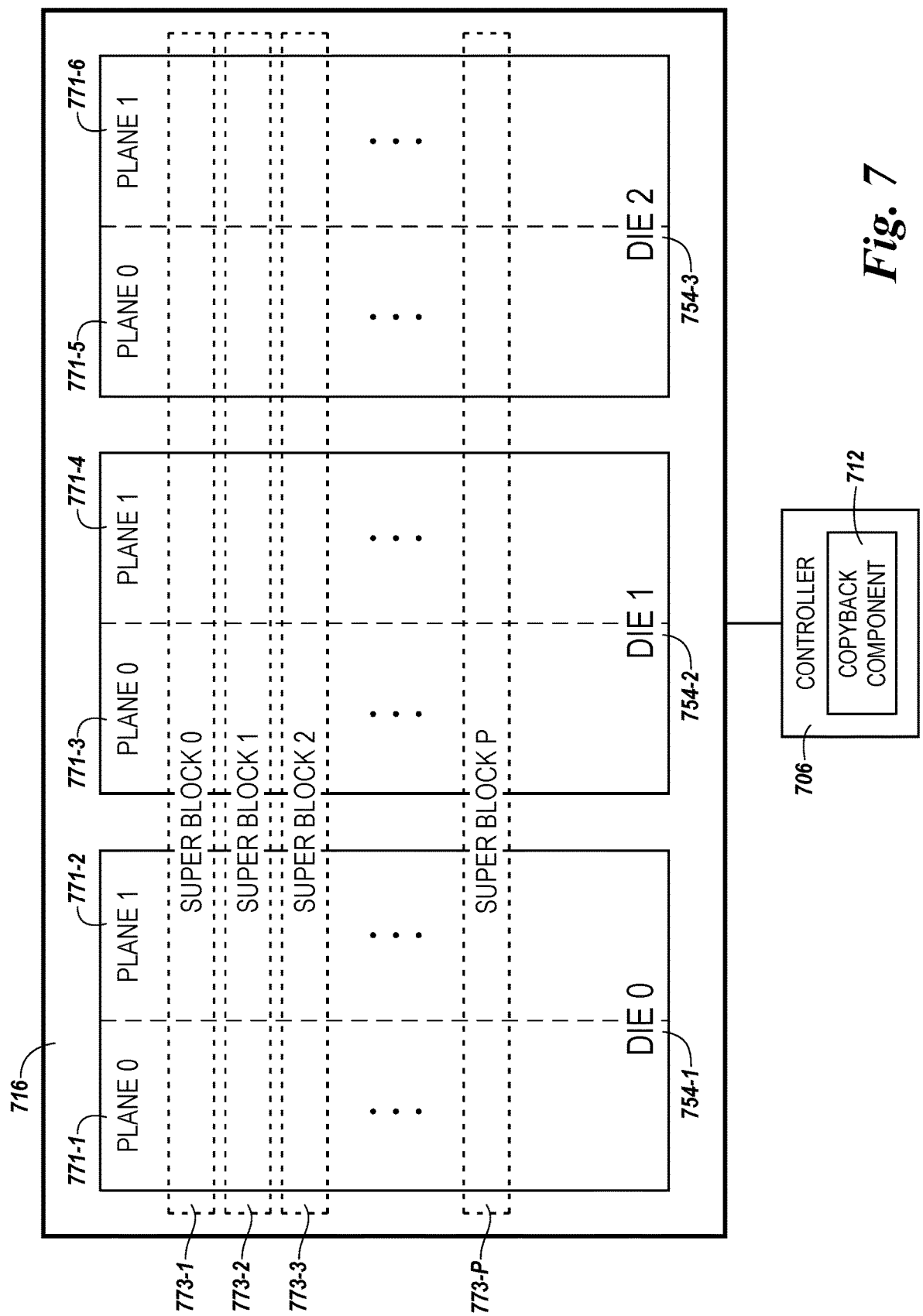
FIG. 7 illustrates a diagram of a number of memory arrays having super blocks in accordance with some embodiments of the present disclosure.

FIG. 7 illustrates a diagram of a number of memory dies 754 having super blocks 773 in accordance with some embodiments of the present disclosure. Each memory dies 754-1, 754-2, and 754-3 can correspond to the memory array/die 654 of FIG. 6 and are located on a memory device 716 (analogous to the memory device 116 illustrated in FIG. 1) that is coupled to a controller 706. The controller 706 can be analogous to the memory sub-system controller 106 illustrated in FIG. 1. The controller 706 can further include a copyback component 712. As described herein, the copyback component 712, in some embodiments, can cause the controller 706 to perform operations described herein with respect the copyback component 112, such as a copyback operation.

Each memory die 754-1, 754-2, and 754-3 can include multiple planes. As illustrated in FIG. 7, for example, the memory die 754-1 includes two planes 771-1 (PLANE 0) and 771-2 (PLANE 1); the memory die 754-2 includes two planes 771-3 (PLANE 0) and 771-4 (PLANE 1); and the memory die 754-3 includes two planes 771-5 (PLANE 0) and 771-6 (PLANE 1), although each memory die is not limited to a particular number of planes it can include.

As used herein, the term "superblock" can refer to a group of memory cells whose memory cells are distributed over multiple planes of a memory die and/or multiple memory dies. For example, as illustrated in FIG. 7, memory cells of each of the superblocks 773-1 (SUPER BLOCK 0), 773-2 (SUPER BLOCK 1), 773-3 (SUPER BLOCK 2), and 773-P (SUPER BLOCK P) are distributed over a respective portion of the planes 771-1 and 771-2 of the memory die 754-1, the planes 771-3 and 771-4 of the memory die 754-2, and the planes 771-5 and 771-6 of the memory die 754-3, as illustrated in FIG. 7. Although three dies are illustrated in FIG. 7, a superblock is not limited to a particular number of dies over which memory cells of the superblock can be distributed.

In some embodiments, an erase operation, can be performed concurrently on multiple blocks of a super block. Alternatively speaking, multiple blocks that form a same super block can be erased substantially simultaneously. Similarly, a write and/or read operation can be performed concurrently on pages of a super block. Alternatively speaking, multiple pages that form a same super block can be written and/or read substantially simultaneously. Accordingly, multiple blocks/pages can be accessed concurrently (substantially simultaneously) for performance of a copyback operation.

In some embodiments, a number of (e.g., one or more) read voltage calibrations performed on one (e.g., sample) superblock can be used as an indicator of whether to perform fewer read voltage calibrations on the other superblocks. In one example, fewer read voltage calibrations (e.g., single read voltage calibration) can be performed on the other superblocks when calibrated read voltages obtained from performing a number of read voltage calibrations on the sample superblock do not vary by a particular amount (e.g., threshold amount). In another example, a read voltage calibration need not be performed on the other superblocks of a group of superblocks when a number of read voltage calibrations performed on a first and a second superblock of the group of results in a same read voltage calibration value (within a threshold tolerance level). In some embodiments, read voltage calibration can be performed independently on a die or logical unit (LUN) basis. However, if calibrated voltages between super blocks from different dies/LUNs are the same and/or within a threshold tolerance (which indicates that there is no significant systematic variations over dies), then a subsequent read voltage calibration performed on one die/LUN may be reused for (e.g., applied to) other dies/LUNs.

Figure 8:
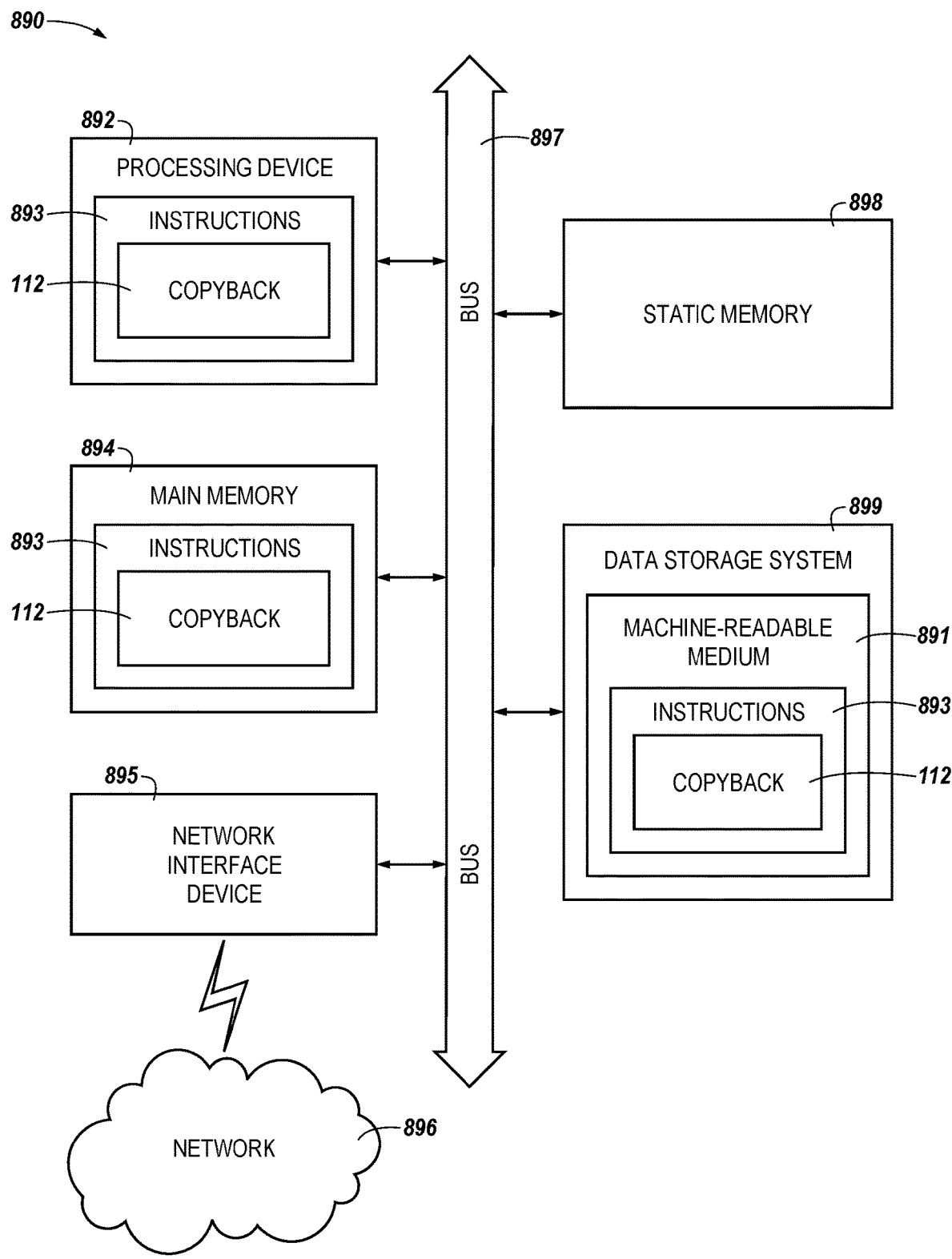
FIG. 8 is a block diagram of an example computer system in which embodiments of the present disclosure may operate.

FIG. 8 illustrates an example machine of a computer system 890 within which a set of instructions, for causing the machine to perform one or more of the methodologies discussed herein, can be executed. In some embodiments, the computer system 890 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., to execute an operating system to perform operations corresponding to the copyback component 112 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or another machine capable of executing a set of instructions (sequential or otherwise) that specify actions to be taken by that machine. Further, while a single machine is illustrated, the term "machine" shall also be taken to include a collection of machines that individually or jointly execute a set (or multiple sets) of instructions to perform one or more of the methodologies discussed herein.

The example computer system 890 includes a processing device 892, a main memory 894 (e.g., read-only memory (ROM), flash memory, dynamic random access memory (DRAM) such as synchronous DRAM (SDRAM) or Rambus DRAM (RDRAM), etc.), a static memory 898 (e.g., flash memory, static random access memory (SRAM), etc.), and a data storage system 899, which communicate with each other via a bus 897.

The processing device 892 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 892 can also be one or more special-purpose processing devices such as an application specific integrated circuit (ASIC), a field programmable gate array (FPGA), a digital signal processor (DSP), network processor, or the like. The processing device 892 is configured to execute instructions 893 for performing the operations and steps discussed herein. The computer system 890 can further include a network interface device 895 to communicate over the network 896.

The data storage system 899 can include a machine-readable storage medium 891 (also known as a computer-readable medium) on which is stored one or more sets of instructions 893 or software embodying any one or more of the methodologies or functions described herein. The instructions 893 can also reside, completely or at least partially, within the main memory 894 and/or within the processing device 892 during execution thereof by the computer system 841, the main memory 894 and the processing device 892 also constituting machine-readable storage media. The machine-readable storage medium 891, data storage system 899, and/or main memory 894 can correspond to the memory sub-system 110 of FIG. 1.

In one embodiment, the instructions 893 include instructions to implement functionality corresponding to a copyback component (e.g., copyback component 112 of FIG. 1). While the machine-readable storage medium 891 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, read-only memories (ROMs), random access memories (RAMs), EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a memory device comprising a plurality of groups of memory cells; and
a processing device communicatively coupled to the memory device, wherein the processing device is configured to:
read a first group of memory cells of the plurality to determine a calibrated read voltage associated with the first group of memory cells;
determine, using the calibrated read voltage associated with the first group of memory cells, a bit error rate (BER) of a second group of memory cells of the plurality;
prior to causing the memory device to perform a copyback operation on the plurality of groups of memory cells:
determine whether to perform a subsequent read voltage calibration on at least the second group of the plurality based, at least partially, on a comparison between the determined BER and a threshold BER.

2. The system of claim 1, wherein:
the plurality of groups of memory cells corresponds to a first superblock and the memory device further comprises a second superblock;
wherein the processing device is configured to:
perform, to obtain a calibrated read voltage to be used with the second superblock, a read voltage calibration for the second superblock independently from the read voltage calibration performed on the first superblock; and
determine whether to perform a subsequent read voltage calibration on at least a portion of the second superblock based on a BER obtained from applying the calibrated read voltage on the portion of the second superblock.

3. The system of claim 1, wherein:
the plurality of groups of memory cells corresponds to a first superblock and the memory device further comprises a second superblock; and
the processing device is configured to:
perform a number of read voltage calibrations on the first superblock;
in response to a determination that voltages levels corresponding to the number of read voltage calibrations do not vary by a particular amount, perform a first number of read voltage calibrations on the second superblock; and
in response to a determination that voltages levels corresponding to the number of read voltage calibrations vary by more than a particular amount, perform a second number of read voltage calibrations on the second superblock, wherein the second number of read voltage calibrations is greater in quantity than the first number of read voltage calibrations.

4. The system of claim 1, wherein the processing device is configured to:

in response to the determined BER being below the threshold BER, skip performance of the subsequent read voltage calibration on the at least second group of the plurality; and in response to the determined BER being above the threshold BER, perform the subsequent read voltage calibration.

5. The system of claim 1, wherein:
the plurality of groups of memory cells corresponds to a block of NAND memory cells;
the first group of memory cells corresponds to a first sample page of the block of NAND memory cells; and
the second group of memory cells corresponds to a second sample page of the block of NAND memory cells;
wherein the processing device is configured to determine whether to perform the subsequent read voltage calibration on the second sample page of the block of NAND memory cells based, at least partially, on a comparison on between the determined BER of the first sample page and the threshold BER.

6. The system of claim 1, wherein the processing device is configured to cause the memory device to perform the copyback operation on data stored in the first group of memory cells using the calibrated read voltage associated with the first group to copy the data from the plurality of groups of memory cells to a different plurality of groups of memory cells.

7. The system of claim 1, wherein:
the memory device comprises a plurality of NAND dies; and
memory cells of the plurality of groups of memory cells are distributed over multiple dies of the plurality of NAND dies.

8. A method, comprising:
in response to a trigger event, receiving a request to copy data stored in a first plurality of groups of memory cells of a cyclic buffer portion of a memory device to a second plurality of groups of memory cells of a snapshot portion of the memory device;
prior to copying the data from the first plurality of groups of memory cells to the second plurality of groups of memory cells via a copyback operation:
determining a calibrated read voltage by performing a read voltage calibration on a first sample group of the first plurality of groups by adjusting a read voltage used to read the first sample group;
determining a bit error rate (BER) of a second sample group of the first plurality of groups using the calibrated read voltage; and
responsive to the determined BER of the second sample group being below a threshold BER, performing the copyback operation on the first plurality of groups of memory cells to copy the data from the first plurality of groups to the second plurality of groups.

9. The method of claim 8, wherein performing the copyback operation on the first plurality of groups of memory cells further comprises:
determining data values stored in the first plurality of groups of memory cells by reading at least one group of the first plurality of groups of memory cells using the calibrated read voltage; and
writing the determined data values to the second plurality of groups of memory cells of the snapshot portion.

10. The method of claim 8, further comprising, responsive to the determined BER being above the threshold BER:
performing a subsequent read voltage calibration on at least the second sample group of the first plurality of groups to determine an additional calibrated read voltage by adjusting the read voltage to a third voltage level; and
performing the copyback operation on:
the first sample page of the first plurality using the calibrated read voltage; and
the at least the second sample group of the first plurality using the additional calibrated read voltage.

11. The method of claim 8, wherein performing the read voltage calibration on the first sample group further comprises:
reading the first sample group using a plurality of read voltages, wherein a plurality of respective BERs is obtained responsive to using the plurality of read voltages; and
determining a voltage level of the calibrated read voltage based on the plurality of obtained BERs.

12. The method of claim 8, further comprising:
operating memory cells of the first plurality of the cyclic buffer portion in a single-level cell (SLC) mode; and
operating memory cells of the second plurality of the snapshot portion in a multiple level cell mode.

13. A system, comprising:
a processing device;
trigger circuitry to signal the processing device responsive to occurrence of a trigger event; and
a memory device coupled to the processing device and comprising:
a cyclic buffer portion comprising a plurality of blocks of NAND memory cells; and
a snapshot portion; and
wherein the processing device is configured to, in response to occurrence of the trigger event:
determine that a particular block of the plurality of blocks of the cyclic buffer portion comprises time based telemetric sensor data to be copied to a snapshot portion;
perform a read voltage calibration on a first sample page of the particular block to determine a calibrated a read voltage;
use the calibrated read voltage to determine a bit error rate (BER) of a number of additional sample pages of the particular block;
in response to the determined BER of the number of additional sample pages being below a threshold BER, perform a copyback operation on all of the pages of the plurality of blocks to copy the time based telemetric sensor data from the particular block of the cyclic buffer portion to the snapshot portion; and
in response to the determined BER of the number of additional sample pages being above the threshold BER, perform read voltage calibration on the number of additional pages of the particular block prior to performing a copyback operation on the number of additional pages of the particular block to copy the telemetric sensor data from the number of additional pages to the snapshot portion.

14. The system of claim 13, wherein the processing device is configured to perform the copyback operation to copy the telemetric sensor data from the particular block of the cyclic buffer portion to the snapshot portion without performing an error correction operation on the telemetric sensor data.

15. The system of claim 13, wherein:
the particular block corresponds to a first superblock and the cyclic buffer portion further comprises a plurality of superblocks including a second superblock; and the processing device is configured to:
  perform a read voltage calibration on each one of the first superblock and the second superblock to obtain respective calibrated read voltages;
  compare voltages levels of the respective calibrated read voltages; and
  skip performance of a read voltage calibration on a remaining one of the plurality of superblocks in response to a determination that the compared voltage levels do not vary by a particular amount.

16. The system of claim 13, wherein:
the particular block is a first superblock of a plurality of superblocks of the cyclic buffer portion, wherein memory cells of each one of the plurality of superblocks are distributed over a plurality of logical units (LUNs); and
the processing device is configured to:
  perform a number of read voltage calibrations on a portion of the first superblock; and
  in response to a determination that voltage levels corresponding to the number of read voltage calibrations do not vary by a particular amount, reuse a calibrated read voltage obtained for one of the plurality of LUNs for the other ones of the plurality of LUNs.

17. The system of claim 13, wherein:
the particular block corresponds to a superblock; and
the processing device is configured to access multiple pages of the particular block concurrently.

18. The system of claim 15, wherein:
the superblock comprises a plurality of physical blocks; and
the processing device is configured to access multiple blocks of the superblock concurrently.

19. The system of claim 13, wherein an amount of the time based telemetric sensor data associated with the trigger event is predefined for a period of time immediately preceding the trigger event.

20. The system of claim 13, further comprising a hold-up capacitor that is configured to provide power for the copyback operation in response to a loss of system power associated with the trigger event.

\* \* \* \* \*